(12) United States Patent
Fujimoto et al.

(10) Patent No.: US 9,915,011 B2
(45) Date of Patent: Mar. 13, 2018

(54) LOW RESISTIVITY SINGLE CRYSTAL SILICON CARBIDE WAFER

(75) Inventors: Tatsuo Fujimoto, Tokyo (JP); Noboru Ohtani, Tokyo (JP); Masakazu Katsuno, Tokyo (JP); Masashi Nakabayashi, Tokyo (JP); Hirokatsu Yashiro, Tokyo (JP)

(73) Assignee: NIPPON STEEL & SUMITOMO METAL CORPORATION, Tokyo (JP)

( * ) Notice: Subject to any disclaimer, the term of this patent is extended or adjusted under 35 U.S.C. 154(b) by 493 days.

(21) Appl. No.: 12/592,747

(22) Filed: Dec. 1, 2009

(65) Prior Publication Data

US 2010/0080956 A1 Apr. 1, 2010

(51) Int. Cl.

| B32B 5/00 | (2006.01) |
|---|---|
| C30B 29/36 | (2006.01) |
| C30B 23/00 | (2006.01) |
| C30B 25/02 | (2006.01) |
| C30B 29/40 | (2006.01) |
| C30B 33/02 | (2006.01) |

(52) U.S. Cl.
CPC .............. *C30B 29/36* (2013.01); *C30B 23/00* (2013.01); *C30B 25/02* (2013.01); *C30B 29/403* (2013.01); *C30B 33/02* (2013.01); Y10T 428/24355 (2015.01)

(58) Field of Classification Search
CPC ......... C30B 23/00; C30B 29/36; C30B 33/02; C30B 25/02; C30B 29/403; Y10T 428/24355
See application file for complete search history.

(56) References Cited

U.S. PATENT DOCUMENTS

| 5,753,938 | A  | * | 5/1998  | Thapar et al. .................. 257/77 |
|---|---|---|---|---|
| 2004/0031971 | A1 | * | 2/2004  | Shimoida et al. ............ 257/199 |
| 2004/0134418 | A1 | * | 7/2004  | Hirooka ........................ 117/101 |
| 2007/0134897 | A1 | * | 6/2007  | Nakamura et al. ........... 438/570 |
| 2007/0243722 | A1 | * | 10/2007 | Nakamura et al. ........... 438/787 |
| 2008/0032880 | A1 | * | 2/2008  | Maruyama et al. ............ 501/88 |
| 2008/0261401 | A1 | * | 10/2008 | Kerr et al. ..................... 438/693 |
| 2009/0317983 | A1 | * | 12/2009 | Miyanagi et al. ............ 438/795 |

OTHER PUBLICATIONS

Simin et al., "7.5kW/cm2 current switch using AlGaN/GaN metal oxide semiconductor heterostructure field Effect Transistors on SiC substrates", Electronics Letters, vol. 36, No. 24, 2000, pp. 2043-2044.*

Kuhr, T.A., et al., "Spontaneous formation of stacking faults in highly doped 4H-SiC during annealing," *Journal of Applied Physics*, vol. 92 (2002), pp. 5863-5871.

(Continued)

*Primary Examiner* — Jonathan C Langman
(74) *Attorney, Agent, or Firm* — Birch, Stewart, Kolasch & Birch, LLP

(57) ABSTRACT

The invention provides a low resistivity silicon carbide single crystal wafer for fabricating semiconductor devices having excellent characteristics. The low resistivity silicon carbide single crystal wafer has a specific volume resistance of 0.001 Ωcm to 0.012 Ωcm and 90% or greater of the entire wafer surface area is covered by an SiC single crystal surface of a roughness (Ra) of 1.0 nm or less.

14 Claims, 1 Drawing Sheet

(56) References Cited

OTHER PUBLICATIONS

Tairov, Yu.M., et al., "General principles of growing large-size single crystals of various silicon carbide polytypes," *Journal of Crystal Growth*, vol. 52 (1981), pp. 146-150.
B. J. Skromme et al., "Oxidation-Induced Crystallographic Transformation in Heavily N-Doped 4H-SiC Wafers," Materials Science Forum, vols. 389-393 (2002) pp. 445-458.
R.S. Okojie et al. "Observation of 4H-SiC to 3C-SiC polytypic transformation during Oxidation", Applied Physics Letters, vol. 79, No. 19, Nov. 5, 2001, p. 3056-3058.
B.J. Skromme et al. "Oxidation-Induced Crystallographic Transformation in Heavily N-Doped 4H-SiC Wafers", Materials Science Forum vols. 389-393 (2002) pp. 455-458.
Thomas A. Kuhr, et al., "Spontaneous formation of stacking faults in highly doped 4H-SiC during annealing", Journal of Applied Physics, vol. 92, No. 10, Nov. 15, 2002, pp. 5863-5871.
H.-J. Rost et al. "Influence of nitrogen doping on the properties of 4H-SiC single crystals grown by physical vapor transport," Journal of Crystal Growth, 257 (2003), pp. 75-83.

\* cited by examiner

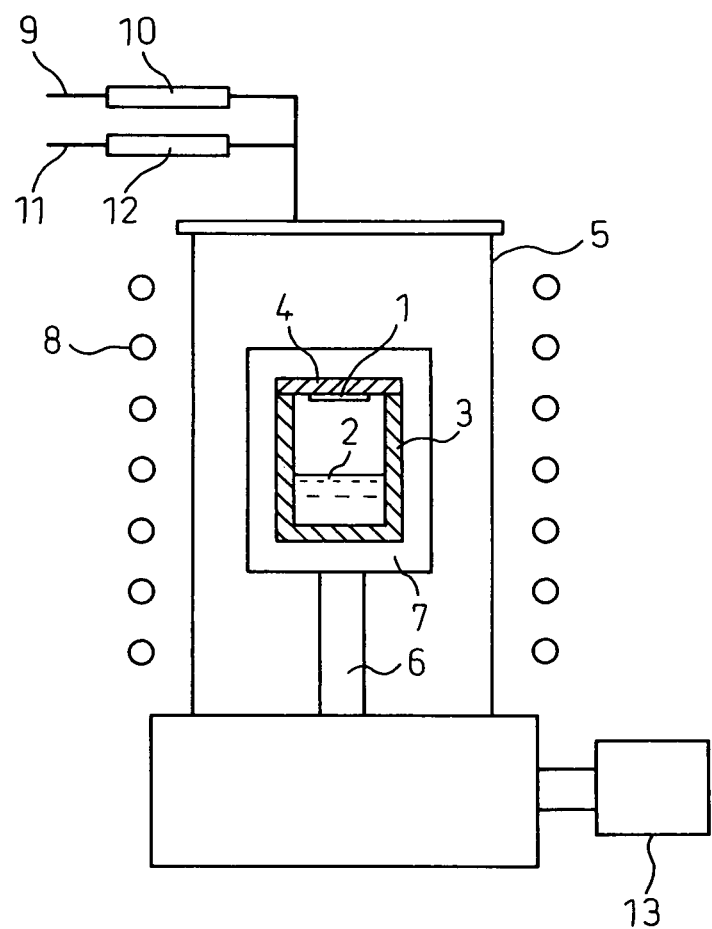

LOW RESISTIVITY SINGLE CRYSTAL SILICON CARBIDE WAFER

TECHNICAL FIELD

This invention relates to a low resistivity silicon carbide single crystal wafer, particularly to a silicon carbide single crystal wafer of low resistivity for use when fabricating a high-performance electronic device.

BACKGROUND ART

Owing to its outstanding physical and chemical properties, including excellent heat resistance, excellent mechanical strength and resistance to radiation, silicon carbide (SiC) has attracted attention for its potential as an environmentally rugged semiconductor material. In recent years, moreover, SiC single crystal wafers have come into increasing demand as wafers for short wavelength optical devices in the blue-to-UV spectral region, high-frequency electronic devices, high-voltage electronic devices and the like. However, no wafer production technology enabling reliable supply of large-area single crystal SiC wafers of high quality on an industrial scale has yet been established. Practical utilization of SiC has therefore been impeded notwithstanding that it is a semiconductor material with these many advantages and possibilities.

Growth of SiC single-crystal of a size suitable for fabrication of semiconductor devices is possible on a laboratory scale using, for example, the sublimation growth process (Lely process).

However, the single crystal obtained by this method is of small area and its dimensions and shape are difficult to control with high accuracy. Nor can the polytype and dopant carrier concentration of the SiC be easily controlled. On the other hand, growth of cubic single crystal SiC is being carried out by heteroepitaxial growth, i.e., growth on a wafer of a different type like silicon (Si), using chemical vapor deposition (CVD). Although large-area single crystal can be obtained using CVD, only single crystal SiC containing many stacking faults and other crystal defects can be grown because the lattice-mismatch between SiC and Si is about 20%. That is, high-quality SiC single crystal is hard to obtain.

The modified Lely process, which conducts sublimation-recrystallization using an SiC single-crystal as a seed, was developed to overcome these problems (Yu. M. Tairov and V. F. Tsvetkov, Journal of Crystal Growth, vol. 52 (1981) pp. 146-150) and is in use at many research institutions. Owing to its use of a seed crystal, the modified Lely process can control the crystal nucleation process and, by controlling the ambient inert gas pressure to around 100 Pa to 15 kPa, can control crystal growth rate with good reproducibility.

Currently, 2-inch (50.8 mm) to 3-inch (76.2 mm) SiC single crystal wafers are being cut from SiC single crystal grown by the modified Lely process and used in epitaxial growth and device fabrication. In the case of, for example, applying an SiC single crystal wafer to an electronic device such as a power device, the SiC single crystal is ordinarily doped with an n-type dopant to produce a wafer of low specific volume resistance (hereinafter sometimes called "resistivity"). The n-type dopant used is nitrogen. The nitrogen doping is performed by mixing nitrogen gas into the argon or other inert gas that is the atmosphere gas used in the modified Lely process. The nitrogen atoms act as donors (electron donors) that replace carbon atoms in the SiC single crystal.

Although use of SiC single crystal wafers to fabricate SiC power devices and the like is being vigorously pursued, the resistivity of commercially available SiC single crystal wafers is fairly high, on the order of 0.015 to 0.020 Ωcm. The size of the wafer resistance relative to the device resistance therefore cannot be ignored.

SUMMARY OF THE INVENTION

As mentioned, the high resistivity of currently available SiC single crystal wafers makes it impossible to ignore the wafer resistance compared to the device resistance. This has led to attempts to lower wafer resistivity by increasing nitrogen doping. However, it was found that when nitrogen doping is increased to lower wafer resistivity to 0.012 Ωcm or less, many stacking faults occur in the single crystal wafer if heat treatment is conducted at a temperature of 1000° C. or greater (T. A. Kuhr et al., Journal of Applied Physics, Vol. 92 (2002) pp. 5863-5871).

The present invention was made in the light of the foregoing circumstances and provides a low resistivity silicon carbide single crystal wafer of good quality that experiences minimal occurrence of stacking faults even during high-temperature annealing.

The present invention consists in (1) A low resistivity silicon carbide single crystal wafer having a specific volume resistance of 0.001 Ωcm to 0.012 Ωcm, 90% or greater of the entire wafer surface area of which is covered by an SiC single crystal surface of a roughness (Ra) of 1.0 nm or less;

(2) A low resistivity silicon carbide single crystal wafer according to (1), wherein 95% or greater of the entire surface area of the SiC single crystal wafer is covered by an SiC single crystal surface of a roughness (Ra) of 1.0 nm or less;

(3) A low resistivity silicon carbide single crystal wafer according to (1) or (2), wherein the specific volume resistance is 0.001 Ωcm to 0.009 Ωcm;

(4) A low resistivity silicon carbide single crystal wafer according to any of (1) to (3), wherein the surface roughness (Ra) is 0.6 nm or less;

(5) A low resistivity silicon carbide single crystal wafer according to any of (1) to (3), wherein the surface roughness (Ra) is 0.3 nm or less;

(6) A low resistivity silicon carbide single crystal wafer according to any of (1) to (5), wherein the crystal polytype of the SiC single crystal wafer is 4H;

(7) A low resistivity silicon carbide single crystal wafer according to any of (1) to (6), wherein the thickness of the SiC single crystal wafer is 0.05 mm to 0.4 mm;

(8) A low resistivity silicon carbide single crystal wafer according to any of (1) to (6), wherein the thickness of the SiC single crystal wafer is 0.05 mm to 0.25 mm;

(9) A low resistivity silicon carbide single crystal wafer according to any of (1) to (8), wherein the offset angle of the SiC single crystal wafer from the {0001} face is 1° to 12°;

(10) A low resistivity silicon carbide single crystal wafer according to any of (1) to (9), wherein the diameter of the wafer is 50 mm to 300 mm;

(11) A low resistivity silicon carbide single crystal wafer according to any of (1) to (10), wherein the basal plane stacking fault density in the wafer after high-temperature annealing in the case of high-temperature annealing at 1000° C. to 1800° C. is 30 cm$^{-1}$ or less;

(12) A low resistivity silicon carbide single crystal wafer according to any of (1) to (10), wherein the basal plane stacking fault density in the wafer after high-temperature annealing in the case of high-temperature annealing at 1000° C. to 1800° C. is 10 cm$^{-1}$ or less;

(13) An SiC epitaxial wafer comprising an SiC film epitaxially grown on a low resistivity silicon carbide single crystal wafer according to any of (1) to (12); and

(14) An epitaxial wafer comprising a film of gallium nitride (GaN), aluminum nitride (AlN), indium nitride (InN) or a mixed crystal thereof epitaxially grown on a low resistivity silicon carbide single crystal wafer according to any of (1) to (12).

This invention enables production of a low resistivity silicon carbide single crystal wafer with a resistivity of 0.012 Ωcm or less that does not readily experience occurrence of stacking faults even during high-temperature annealing at, for example, 1000° C. to 1800° C. Such a low resistivity silicon carbide single crystal wafer can be used to fabricate, inter alia, high-frequency, high-breakdown voltage electronic devices having excellent electrical properties and blue light emitting devices having excellent optical properties.

BRIEF DESCRIPTION OF THE DRAWING

FIG. 1 is a diagram showing an example of a single-crystal growth apparatus used to produce the low resistivity silicon carbide single crystal wafer according to the present invention.

MOST PREFERRED EMBODIMENT

The low resistivity silicon carbide single crystal wafer of this invention has 90% or more of the whole wafer surface area covered with an SiC single crystal surface of a roughness (Ra) of 1.0 nm or less. It therefore experiences almost no occurrence of stacking faults even when exposed to high-temperature annealing of 1000° C. greater in the course of such SiC single crystal wafer processes as epitaxial growth (1500 to 1600° C., for about 2 to 10 h), thermal oxidation (1000 to 1300° C., for about 1 to 4 h), and recovery annealing after ion injection (1700 to 1800° C., for a few to around 10 min). The invention wafer can therefore be used to fabricate high-performance devices.

The mechanism of stacking fault occurrence will be discussed first. It is known that when an SiC single crystal wafer of low resistivity (0.012 Ωcm or less) is annealed at a high temperature of 1000° C. or greater for about 1 to 2 h, stacking faults (planar faults) occur in the basal plane. These stacking faults differ in structure from ordinary stacking faults caused by mechanical stress or the like.

A stacking fault occurring as the result of mechanical stress or the like is formed by the stacking sequence position of a given single molecular layer being different from the surrounding regular stacking sequence of positions. In contrast, a stacking fault occurring during annealing of a low resistivity silicon carbide single crystal wafer is formed by two adjacent molecular layers being different from the surrounding regular stacking sequence of positions. In other words, it is a double stacking fault. It is known that electron capture by such a double stacking fault lowers the free energy of the whole system. This is why an SiC single crystal wafer low in resistivity (i.e., high in concentration of electrons) is susceptible to stacking fault occurrence.

Although it was thus known prior to this invention that the double stacking fault occurs owing to lowering of the free energy of the whole system, it was not clear what kind of defect acts as the nucleus of the occurrence. The stacking faults in SiC single crystal are usually caused by structural extension of basal plane dislocations present in the single crystal. A basal plane dislocation in an SiC single crystal is split into two partial dislocations and the region surrounded with the two partial dislocations is a stacking fault. When some kind of driving force acts on the partial dislocations (e.g., when an electron-hole pair recombines at the dislocations), one of them experiences gliding movement that extends (expands the area of) the region between the partial dislocations, i.e., the stacking fault. While this is the ordinary stacking fault formation mechanism, the double stacking fault observed in a low resistivity SiC single crystal wafer requires basal plane dislocations present in adjacent molecular planes to develop as a pair (such basal plane dislocations present in adjacent molecular planes are hereinafter called a "basal plane dislocation pair"). However, the density of basal plane dislocations in an SiC single crystal is on the order of $10^5$ cm$^{-2}$ at the most, making the presence of basal plane dislocation pairs in the grown crystal improbable.

Through numerous experiments, the inventors discovered that double stacking fault occurrence is strongly dependent on the wafer surface condition and that the number of stacking faults generated increases when surface roughness is great.

This indicates that the nucleus of double stacking fault formation depends not so much on the grown crystal but more on the presence of damaged surface layers introduced during wafer processing. It is known that when the wafer surface roughness becomes great, the number of damaged surface layers introduced during polishing generally increases, i.e., the crystal defect density near the wafer surface increases. Therefore, more basal plane dislocation pairs that are potential double stacking fault nuclei are likely to be present near the surface of a wafer with larger surface roughness. Prior to the research that led to the present invention, nothing at all was known about where and by what mechanism double stacking fault nuclei are introduced. The inventors determined that nuclei are present near the wafer surface and that they are introduced in the course of polishing and other surface processing of the wafer.

Since the low resistivity SiC single crystal wafer of this invention has 90% or more of the whole wafer surface area covered with a smooth surface whose roughness is 1.0 nm or less, it is substantially free of basal plane dislocation pairs that might act as double stacking fault nuclei. It therefore does not experience occurrence of stacking faults that would adversely affect devices even if exposed to annealing under a high temperature. As termed here, "surface roughness" means the arithmetic mean surface roughness Ra measured in a 10 μm square region on the wafer surface. As indicated by Equation (1), the arithmetic mean surface roughness is defined as the value obtained by calculating the average height ($H_{av}$) of measured heights (H(q)) at points (q) of a given region (area S) and integrating and averaging the absolute values of the differences between the heights (H(q)) and the average value ($H_{av}$) of the measured points.

$$Ra = \frac{1}{S}\int_0^S |H(q) - H_{av}|\, dq \qquad (1)$$

The surface roughness is required to be 1.0 nm or less, preferably 0.6 nm or less, and more preferably 0.3 nm or less. When the surface roughness is greater than 1.0 nm, the density of basal plane dislocation pairs near the surface increases to make occurrence of stacking faults likely during high-temperature annealing. By further lowering the surface roughness preferably to 0.6 nm or less and more preferably 0.3 nm or less, the density of basal plane dislocation pairs near the surface can be additionally reduced to further inhibit stacking fault occurrence during high-temperature annealing.

The percentage of the total surface area of the wafer accounted for by the smooth surface (silicon carbide single surface with Ra of 1.0 nm or less) must be 90% or greater and preferably 95% or greater. When the smooth surface accounts for less than 90%, stacking faults occurring near the surface outside the smooth surface adversely affect device properties. And when, as is preferable, the smooth surface accounts for 95% or greater of the total surface area, stacking faults occurring near the surface outside the smooth surface have a still smaller effect on devices.

The resistivity of the wafer must be 0.001 Ωcm to 0.012 Ωcm and preferably 0.001 Ωcm to 0.009 Ωcm. When the resistivity is greater than 0.012 Ωcm, the magnitude of wafer resistance relative to the device resistance undesirably becomes too large to be ignored.

When, as is preferable, the resistivity of the wafer is 0.001 Ωcm to 0.009 Ωcm, the wafer resistance becomes still smaller relative to the device resistance.

Although lower wafer resistivity is better from the viewpoint of device properties, 0.001 Ωcm is substantially the lower limit of resistivity because there is a limit to the solid solubility of electrically active dopant in the SiC single crystal.

The wafer thickness is preferably 0.05 mm to 0.4 mm and more preferably 0.05 mm to 0.25 mm. When the wafer thickness is greater than 0.4 mm, the wafer resistivity is undesirably increased by the wafer thickness. When, as is preferable, the wafer thickness is 0.05 mm to 0.25 mm, the wafer resistance becomes still smaller relative to the device resistance. Although thinner wafer thickness is better from the viewpoint of device properties, around 0.05 mm is substantially the lower limit of wafer thickness taking handleability (prevention of in-process breakage and the like) into account.

The polytype of the wafer crystal is not particularly limited, but 4H polytype can be considered best when the invention single crystal wafer is to be applied to an electronic device such as a power device. This is because the high electron mobility of the 4H polytype SiC single crystal in comparison with those of other polytypes enables fabrication of a higher performance power device.

While it is considered that the present invention can exhibit its effect irrespective of the crystallographic orientation of the SiC single crystal wafer, SiC single crystal wafers used to fabricate power devices and the like have an offset angle of around 1° to 12° in the [11-20] or [1-100] direction from the {0001} plane. The present invention is therefore preferably applied to this type of wafer. This is because fabrication of power devices and the like requires epitaxial growth of an SiC single crystal film on the SiC single crystal wafer, but a good quality SiC epitaxial film is difficult to deposit when the offset angle from the {0001} plane is less than 1° or greater than 12°.

The SiC single crystal wafer of the present invention is fabricated by slicing and polishing a low resistivity SiC single crystal ingot produced by the modified Lely process. In the modified Lely process, SiC single crystal and SiC powder charged into a crucible (usually made of graphite) as seed crystal and feedstock, respectively, are heated at around 2000 to 2400° C. in an inert gas atmosphere (133 to 13.3 kPa) of argon, for example. The temperature gradient at this time is established so that the temperature of the seed crystal is somewhat lower than that of the feedstock powder. The sublimed feedstock is dispersed and transported toward the seed crystal owing to the concentration gradient (formed by the temperature gradient) to recrystallize on the seed crystal.

In this process, the resistivity of the crystal can be controlled to a low level by adding a dopant gas to the atmosphere gas composed of inert gas or by mixing a dopant element or compound thereof into the SiC feedstock powder. In the case of producing an n-type low resistivity SiC single crystal, nitrogen gas is mixed into the atmosphere gas of argon or the like.

It is also possible to dope the SiC single crystal wafer with n-type dopant using some other method. For example, a wafer doped after fabrication by injection or dispersion of ions from the wafer surface can also achieve the effect of the present invention.

The low resistivity SiC single crystal ingot fabricated by the modified Lely process is sliced into sheets (wafers) in the following step. Ordinarily, in order to enable slicing of wafers with the desired surface orientation, the crystallographic orientation of SiC single crystal is measured by X-ray diffraction before slicing and the single crystal ingot is assigned a reference surface for slicing.

The SiC single crystal is sliced using a multi-wire saw, or an ID saw slicing machine. The ID saw slicing machine slices the work (SiC single crystal ingot) by rapidly rotating a blade having diamond particles bonded on its inner periphery. The multi-wire saw cuts the work by high-speed reciprocation of multiple fine wires strung around grooved guide rollers under prescribed tension. The spacing between the multiple wires can be varied to enable simultaneous slicing of multiple wafers of desired thickness from a single crystal ingot. Since abrasive grains are supplied in the form of free abrasive grains, damage to the work can be minimized. Moreover, the multi-wire saw has an extremely small kerf loss of 0.2 mm or less and thus offers high material yield that makes the saw ideal for slicing a high unit price material like SiC single crystal.

The sheets cut from the SiC single crystal (wafers) in the slicing step are followed by a lapping step for thickness adjustment and then polished. Diamond slurry is most often used as the abrasive. In order to avoid leaving a process-damaged layer, the polishing is usually performed with a soft polisher while progressively reducing the load from high to low. In the diamond polishing of the SiC single crystal wafer, the polishing is conducted using such a scheme to achieve a polished surface of a roughness, expressed in Ra, from 50 nm to 1 nm.

Mechanochemical polishing is ordinarily used to obtain a super-flat surface (Ra: 0.3 nm or less) for use in semiconductor device fabrication. An SiC wafer having a low-damage, super-flat surface is obtained using a polishing liquid obtained by mixing fine granular colloidal silica with a liquid having etching action. The general practice for increasing polishing speed is to add an oxidation accelerator like aqueous hydrogen peroxide solution to the colloidal silica slurry. Application of such mechanochemical polishing to both sides of the wafer, except for the edges, makes it possible to cover 95% or greater of the entire wafer surface area with a smooth surface of a roughness (Ra) of 0.3 nm or less.

The method for achieving a smooth wafer surface is not limited to the polishing process described above, and it is possible instead to utilize plasma surface processing or the like, insofar as the desired flatness can be realized.

The SiC single crystal wafer of this invention is used to fabricate SiC semiconductor devices. The diameter of the wafer is preferably 50 to 300 mm. The SiC single crystal of this invention is suitable for use in mass producing various types of devices because its diameter of 50 to 300 mm makes it possible to produce devices using a production line already industrially established for device fabrication using conventional semiconductor wafers (e.g., Si and GaAs wafers).

Moreover, even when the wafer is high-temperature annealed in the temperature range of 1000° C. to 1800° C., the stacking fault density after the high-temperature annealing is as low as 30 cm$^{-1}$ or less preferably 10 cm$^{-1}$ or less, which makes the wafer particularly suitable for the fabrication of high-current, high-output devices. For example, in the case of a high-current (current rating per device: 50 to 100 AMP) SiC power device measuring around 5 mm square, the device characteristics are adversely affected when the stacking fault density in the wafer comes to exceed 30 cm$^{-1}$ so that the average stacking fault density per device rises to greater than 7.5 faults.

When, as is preferable, the stacking fault density is 10 cm$^{-1}$ or less, the average stacking fault density in the aforesaid 5-mm square power device becomes 2.5 faults or less per device, thereby further lowering the adverse effect on device characteristics.

As was pointed out earlier, when the SiC single crystal wafer is applied to a power device or similar, an epitaxial film must be deposited on the SiC single crystal wafer. The deposition of the epitaxial film enhances the purity and quality of the single crystal at the device forming region, making it possible to fabricate devices of even higher performance.

A number of methods can conceivably be used to form the epitaxial film on the SiC single crystal wafer. The one most generally used is epitaxial growth by the CVD method. In CVD, the film is formed by decomposing supplied feedstock gas using heat, plasma or the like. Another usable method utilizing growth from a vapor phase is sublimation epitaxy. This method grows a film using as feedstock a sublimation gas from a solid feedstock (e.g., single crystal, polycrystal or sintered body) placed near the crystal growth surface of the wafer crystal.

Epitaxial growth from liquid phase is also widely utilized. The wafer crystal is immersed in a liquid containing the feedstock and epitaxial growth is carried out by gradually solidifying the feedstock. Other usable methods include molecular beam epitaxy, laser ablation, ion plating and electroplating.

EXAMPLES

Examples of the invention and comparative examples are set out in the following.

Example 1

FIG. 1 is an example of an SiC single-crystal growth apparatus utilizing the modified Lely process, which is used to produce the low resistivity SiC single crystal wafer according to the present invention. The single-crystal growth apparatus will be briefly explained first. Crystal growth is conducted by subliming SiC powder 2 (feedstock) and recrystallizing the sublimed SiC on SiC single-crystal 1 used as seed crystal. The SiC single crystal 1 that is the seed crystal is attached to the inner surface of a graphite lid 4 of a graphite crucible 3. The feedstock SiC powder 2 is charged into the graphite crucible 3. The crucible 3 is mounted on a graphite support rod 6 inside a double-wall quartz tube 5. Graphite felt 7 is installed around the graphite crucible 3 to form a heat shield. The double-wall quartz tube 5 can be evacuated to a high vacuum (10$^{-3}$ Pa or less) by a vacuum pumping apparatus 13. The pressure of the internal atmosphere is controlled with argon gas and nitrogen gas by supplying argon gas from an argon gas tube 9 through an argon gas mass flow controller 10 and supplying nitrogen gas from a nitrogen gas tube 11 through a nitrogen gas mass flow controller 12.

A work coil 8 is installed around the double-wall quartz tube 5, and the graphite crucible 3 can be heated to heat the feedstock and seed crystal to the desired temperatures by passing high-frequency electric current through the work coil 8. Light paths measuring 2 to 4 mm in diameter are formed in the middle of the graphite felt covering the top and bottom of the crucible, light is extracted from the top and bottom of the crucible, and the crucible temperature is measured with ratio-temperature thermometers. The temperature of the crucible bottom is treated as the feedstock temperature and the temperature of the crucible top is treated as the seed crystal temperature.

An example of producing low resistivity SiC single crystal using the crystal growth apparatus will now be explained. A 50-mm diameter, 1-mm thick 4H SiC single crystal wafer having the {0001} plane as the principal plane was cut from an SiC single crystal ingot grown beforehand, polished and used as the seed crystal 1. The seed crystal 1 was attached to the inner surface of the lid 4 of the graphite crucible 3. The feedstock (SiC powder) 2 was charged into the graphite crucible 3. The graphite crucible 3 charged with the feedstock 2 was sealed by closing the lid 4 with the seed crystal 1 attached, covered with the graphite felt 7, set on top of the graphite support rod 6, and placed inside the double-wall quartz tube 5. Once the interior of the double-wall quartz tube 5 had been evacuated, current was passed through the work coil 8 to elevate the feedstock temperature to 2000° C. Argon gas containing 45% nitrogen was then passed in as atmosphere gas and the feedstock temperature was increased to the desired temperature of 2400° C. while maintaining the internal pressure of the quartz tube at about 80 kPa.

The quartz tube internal pressure was thereafter reduced to the growth pressure of 1.3 kPa over about 30 min and crystal growth was then continued for 50 hr. The temperature gradient in the crucible during crystal growth was 15° C./cm and the crystal growth velocity was about 0.6 mm/h on average. The grown crystal measured 51.5 mm in diameter and about 30 mm in height.

Analysis of the obtained SiC single crystal by X-ray diffraction and Raman scattering confirmed growth of 4H SiC single crystal.

For use in assessing the resistivity and post-annealing stacking fault density of the grown crystal, several wafers of 50.8-mm diameter and 0.4-mm thickness were cut from the grown SiC single crystal ingot to have a plane offset from {0001} of 8° toward [11-20].

The wafers were mechanochemically polished using a colloidal silica slurry containing an oxidation accelerator (aqueous hydrogen peroxide solution). The polished wafer thickness was 0.34 mm. Both sides of the wafer were polished, so that 95% or greater of the entire surface area was covered by a smooth surface of a roughness of 0.3 nm or less. When an atomic force microscope was used to measure the smooth surface roughness (Ra) at the mechanochemically polished surface, the value obtained was 0.19 nm. The percentage of the entire surface accounted for by the smooth surface was assessed not only using the atomic force microscope but also using an optical roughness tester and a Nomarski differential interference microscope. Specifically, the surface roughness at several surface points was measured with the atomic force microscope or the optical roughness tester, whereafter the area of regions exhibiting surface morphology similar to the measured points was estimated using the Nomarski differential interference microscope.

The resistivity of the wafer fabricated in the process described above was measured by the eddy current method. The value obtained was 0.0084 Ωcm.

The wafers were next placed in a high-temperature annealing furnace and annealed at 1100° C. for 2 h. The annealing was conducted in an argon gas atmosphere. After the annealing, the wafers were removed from the furnace, their surfaces were etched with molten KOH at about 530° C., and the etch pits corresponding to stacking faults were observed with an optical microscope. The value obtained for the average stacking fault density in the wafers was 7.6 $cm^{-1}$. The average stacking fault density was substantially the same in the case of other wafers subjected to similar high-temperature annealing at 1200° C. and 1400° C.

Next, an SiC epitaxial growth experiment was conducted using the low resistivity SiC single crystal wafer (another wafer that was similarly annealed (for 2 h at 1100° C. in an argon atmosphere)). An SiC epitaxial film was grown by the CVD process under conditions of a growth temperature of 1500° C. and flow rates of silane ($SiH_4$), propane ($C_3H_8$) and hydrogen ($H_2$) of $5.0\times10^{-9}$ $m^3$/sec, $3.3\times10^{-9}$ $m^3$/sec and $5.0\times10^{-5}$ $m^3$/sec, respectively. The growth pressure was atmospheric pressure. The growth time was 2 h and the film grew to a thickness of about 5 μm.

Following epitaxial film growth, the surface morphology of the epitaxial film obtained was observed with a Nomarski optical microscope. The SiC epitaxial film grown was found to be very smooth over the whole wafer surface and to have good surface morphology with few pits or other surface defects.

Further, a wafer was cut from the SiC single crystal (low resistivity SiC single crystal) obtained as set out earlier to have 0° offset from the (0001) plane and both sides of the wafer were mechanochemically polished in the same manner.

The polished wafer thickness was 0.32 mm. The wafer was annealed at 1100° C. for 2 h in an argon atmosphere. Next, a GaN film was epitaxially grown on the wafer by the metal organic chemical vapor deposition (MOCVD) process under conditions of a growth temperature of 1050° C. and flow rates of trimethyl gallium (TMG), ammonia ($NH_3$) and silane ($SiH_4$) of $54\times10^{-6}$ mol/min, 4 liter/min and $22\times10^{-11}$ mol/min, respectively. The growth pressure was atmospheric pressure. The growth time was 60 min and an n-type GaN film was grown to a thickness of 3 μm.

Observation of the surface condition of the obtained GaN film with the Nomarski optical microscope showed that a very smooth morphology was obtained throughout the wafer surface and that a high-quality GaN film was formed over the entire surface.

Example 2

In order to examine the effect of wafer surface roughness, an experiment was conducted using a different polishing method from that in Example 1. A low resistivity SiC single crystal ingot was grown as in Example 1. A wafer cut from the ingot to the same specifications (plane orientation and thickness) as in Example 1 was polished using a diamond slurry of 0.5 μm grain size. The polished wafer thickness was 0.35 mm and its average surface roughness (Ra) was 0.6 nm. Both sides of the wafer were polished, so that 95% or greater of the entire surface area was covered by a smooth surface of a roughness of 1.0 nm or less.

The wafer fabricated was then annealed for 2 h at 1100° C. in an argon atmosphere. The average stacking fault density of the annealed wafer determined by molten KOH etching was 21 $cm^{-1}$. The average stacking fault density was substantially the same in the case of other wafers subjected to similar high-temperature annealing at 1200° C. and 1400° C.

Example 3

In order to examine the effect of wafer resistivity, an experiment was conducted similarly to in Example 1 but using a wafer of different resistivity.

As in Example 1, SiC single crystal was produced by the modified Lely process. The crystal growth was conducted in an atmosphere gas of argon gas containing 33% nitrogen gas. A wafer of 50.8-mm diameter and 0.4-mm thickness was cut from the grown SiC single crystal ingot to have a plane offset from {0001} of 8° toward [11-20]. The wafer was mechanochemically polished using a colloidal silica slurry containing an oxidation accelerator (aqueous hydrogen peroxide solution). The polished wafer thickness was 0.35 mm. Both sides of the wafer were polished, so that 95% or greater of the entire surface area was covered by a smooth surface of a roughness of 0.22 nm or less. When the resistivity of the wafer was measured by the eddy current method, the value obtained was 0.0114 Ωcm.

The wafer was then placed in a high-temperature annealing furnace and annealed at 1100° C. for 2 h. The annealing was conducted in an argon gas atmosphere. After the annealing, the wafer was removed from the furnace, its surface was etched with molten KOH at about 530° C., and the etch pits corresponding to stacking faults were observed with the optical microscope. The value obtained for the average stacking fault density in the wafer was 5.6 $cm^{-1}$. The average stacking fault density was substantially the same in the case of other wafers subjected to similar high-temperature annealing at 1200° C. and 1400° C.

Example 4

In order to examine the effect of wafer thickness, an experiment was conducted similarly to in Example 1 but using a wafer of different thickness.

A low resistivity SiC single crystal ingot was grown as in Example 1. A wafer was cut from the ingot to same specifications as in Example 1, except for the thickness, which was 0.30 mm. Both sides of wafer were mechanochemically polished using a colloidal silica slurry containing aqueous hydrogen peroxide solution. The polished wafer thickness was 0.23 mm, the surface roughness (Ra) was 0.19 nm, the smooth surface coverage rate was 95% or greater.

The so-fabricated wafer was annealed at 1100° C. for 2 h in an argon atmosphere. The average stacking fault density of the annealed wafer determined by molten KOH etching was 8.1 $cm^{-1}$. The average stacking fault density was substantially the same in the case of other wafers subjected to similar high-temperature annealing at 1200° C. and 1400° C.

Comparative examples falling outside the scope of the present invention will be explained next. The following comparative examples indicate the stacking fault density and other evaluation results for low resistivity SiC single crystal wafers not covered with a smooth surface over 90% or greater of their total surface area.

Comparative Example 1

First, several wafers of 50.8-mm diameter and 0.4-mm thickness were cut from a 4H low resistivity SiC single crystal ingot (grown in the manner of Example 1) to have a plane offset from {0001} of 8° toward [11-20]. The cut wafers were polished. While the (0001) Si face side of each wafer was mechanochemically polished using colloidal silica slurry containing aqueous hydrogen peroxide solution, the opposite side, i.e., the (000-1) C face side, was mechanochemically polished using a diamond slurry of 3-μm grain diameter.

The resulting surface roughness of the (0001) Si face side of the wafer was 0.21 nm, but that of the (000-1) C face side was 5.5 nm, so that the coverage rate of the wafer by the smooth surface (silicon carbide single crystal surface of 1.0 nm or less surface roughness) was 50% or less. The thickness of the polished wafer was 0.35 mm and its resistivity was 0.0087 Ωcm.

The wafers were next annealed at 1100° C. for 2 h in an argon atmosphere. After the annealing, the wafer surfaces were etched with molten KOH at about 530° C., and the etch pits corresponding to stacking faults were observed with an optical microscope. The value obtained for the average stacking fault density in the wafers was 820 cm$^{-1}$.

Next, a similarly fabricated SiC wafer with a smooth surface coverage rate of 50% or less was annealed at 1100° C. for 2 h in an argon atmosphere and thereafter used as a wafer for epitaxially growing an SiC single crystal film The epitaxial film was deposited on the (0001) Si face side. The epitaxial growth was carried out by the CVD process under conditions of a growth temperature of 1500° C. and flow rates of silane, propane and hydrogen of $5.0 \times 10^{-9}$ m$^3$/sec, $3.3 \times 10^{-9}$ m$^3$/sec and $5.0 \times 10^{-5}$ m$^3$/sec, respectively. The growth pressure was atmospheric pressure. The growth time was 6 h and the film grew to a thickness of about 15 μm.

Following the epitaxial growth, the surface morphology of the epitaxial film obtained was observed with the Nomarski optical microscope. Many epitaxial defects were found to have formed at sites corresponding to the stacking faults in the wafer.

Further, a (0001) SiC single crystal wafer with an offset angle of 0° was similarly cut from the aforesaid low resistivity SiC single crystal ingot. Also similarly, the (0001) Si face side was mechanochemically polished using colloidal silica slurry containing aqueous hydrogen peroxide solution, and the (000-1) C face side was mechanochemically polished using a diamond slurry of 3-μm grain diameter. The smooth surface (roughness of 1.0 nm or less) coverage rate of the wafer was 50% or less.

The thickness of the polished wafer was 0.32 mm. The wafer was annealed at 1100° C. for 2 h in an argon atmosphere. Next, a GaN film was epitaxially grown on the wafer by the MOCVD process. The (0001) Si face side was used as the epitaxial growth surface. The growth was conducted under conditions of a growth temperature of 1050° C. and flow rates of trimethyl gallium, ammonia and silane of $54 \times 10^{-6}$ mol/min, 4 liter/min and $22 \times 10^{-11}$ mol/min, respectively. The growth pressure was atmospheric pressure. The growth time was 60 min and an n-type GaN film was grown to a thickness of 3 μm.

Observation of the surface condition of the obtained GaN film with the Nomarski optical microscope showed that surface defects thought to be caused by the stacking faults in the wafer had occurred over the entire wafer surface.

Comparative Example 2

In order to examine the effect of wafer surface roughness, an experiment was conducted in which a wafer polished using a diamond slurry of larger grain size than in Comparative Example 1 was annealed similarly to in Comparative Example 1.

A single crystal ingot was grown in the manner of Comparative Example 1. Several wafers were cut from the ingot to have the same specification (plane orientation and thickness) as in Comparative Example 1. Next, the (0001) Si face side was mechanochemically polished using colloidal silica slurry containing aqueous hydrogen peroxide solution, and the opposite side, i.e., the (000-1) C face side, was mechanochemically polished using a diamond slurry of 9-μm grain diameter. The resulting surface roughness of the (0001) Si face side of the wafer was 0.20 nm, but that of the (000-1) C face side was 55 nm, so that the smooth surface coverage rate of the wafer was 50% or less.

The thickness of the polished wafer was 0.35 mm and its resistivity was 0.0091 Ωcm. The wafer was next annealed at 1100° C. for 2 h in an argon atmosphere. As in Comparative Example 1, the surface of the annealed was etched with molten KOH at about 530° C., and the etch pits corresponding to stacking faults were observed with the optical microscope. The value obtained for the average stacking fault density in the wafer was 2700 cm$^{-1}$.

The invention claimed is:

1. A low resistivity silicon carbide single crystal wafer having a specific volume resistance of 0.001 Ωcm to 0.012 Ωcm, wherein 90% or greater of the entire wafer surface area over both sides of the wafer has a surface roughness (Ra) of 1.0 nm or less, wherein the basal plane stacking fault density in the wafer after high-temperature annealing at 1000° C. to 1800° C. is 30 cm$^{-1}$ or less.

2. A low resistivity silicon carbide single crystal wafer according to claim 1, wherein 95% or greater of the entire surface area over both sides of the wafer has a surface roughness (Ra) of 1.0 nm or less.

3. A low resistivity silicon carbide single crystal wafer according to claim 1, wherein the specific volume resistance is 0.001 Ωcm to 0.009 Ωcm.

4. A low resistivity silicon carbide single crystal wafer according to claim 1, wherein the surface roughness (Ra) is 0.6 nm or less.

5. A low resistivity silicon carbide single crystal wafer according to claim 1, wherein the surface roughness (Ra) is 0.3 nm or less.

6. A low resistivity silicon carbide single crystal wafer according to claim 1, wherein the crystal polytype of the SiC single crystal wafer is 4H.

7. A low resistivity silicon carbide single crystal wafer according to claim 1, wherein the thickness of the SiC single crystal wafer is 0.05 mm to 0.4 mm.

8. A low resistivity silicon carbide single crystal wafer according to claim 1, wherein the thickness of the SiC single crystal wafer is 0.05 mm to 0.25 mm.

9. A low resistivity silicon carbide single crystal wafer according to claim 1, wherein an offset angle of the SiC single crystal wafer from an {0001} face is 1° to 12°.

10. A low resistivity silicon carbide single crystal wafer according to claim 1, wherein the diameter of the wafer is 50 mm to 300 mm.

11. A low resistivity silicon carbide single crystal wafer according to claim 1, wherein the basal plane stacking fault density in the wafer after high-temperature annealing in the case of high-temperature annealing at 1000° C. to 1800° C. is 10 cm$^{-1}$ or less.

12. An SiC epitaxial wafer comprising an SiC film epitaxially grown on a low resistivity silicon carbide single crystal wafer according to claim 1.

13. An epitaxial wafer comprising a film of gallium nitride (GaN), aluminum nitride (AlN), indium nitride (InN) or a mixed crystal thereof epitaxially grown on a low resistivity silicon carbide single crystal wafer according to claim 1.

14. A low resistivity silicon carbide single crystal wafer according to claim 1, wherein the surface roughness (Ra) is measured in a 10 μm square region on the wafer surface.

* * * * *